June 11, 1968 B. D. JAMES 3,388,301

MULTICHIP INTEGRATED CIRCUIT ASSEMBLY WITH INTERCONNECTION STRUCTURE

Filed Dec. 9, 1964 2 Sheets-Sheet 1

INVENTOR.
Brian David James
BY
Fehr and Swain
Attorneys

INVENTOR.
Brian David James
BY Flehr and Swain
Attorneys

3,388,301
MULTICHIP INTEGRATED CIRCUIT ASSEMBLY WITH INTERCONNECTION STRUCTURE

Brian David James, Menlo Park, Calif., assignor to Signetics Corporation, Sunnyvale, Calif., a corporation of California Filed Dec. 9, 1964, Ser. No. 417,091
9 Claims. (Cl. 317—234)

This invention relates to a multichip integrated circuit assembly with an interconnection structure and more particularly to such an assembly in which the passive circuit elements and the junction circuit elements are carried by separate chips.

In the fabrication of integrated circuits, thin films have been utilized for forming passive devices, namely, resistors in the integrated circuits. The formation of these thin films on the chips has involved additional steps over that required for the making of active devices in the chips. In order to form such passive devices on chips with active devices, it has been necessary to utilize steps in the thin film formation which are compatible with at least certain steps in the formation of the active devices. Because of this fact, certain limitations are imposed upon the type of steps which can be utilized in the thin film formation and the type of thin film materials which can be utilized. In addition, it has been found that when active and passive devices are utilized on the same chip, the overall yield of satisfactory integrated circuits on the chip is substantially reduced. Because of these difficulties, there is a need for a new and improved semiconductor assembly.

In general, it is an object of the present invention to provide a semiconductor assembly of the above character which overcomes the above named disadvantages.

Another object of the invention is to provide a semiconductor assembly of the above character in which the need for using compatible steps in the formation of the active and passive devices is eliminated.

Another object of the invention is to provide a semiconductor assembly of the above character in which the active and passive devices are formed on separate chips.

Another object of the invention is to provide a semiconductor assembly of the above character in which upside down bonding is utilized.

Another object of the invention is to provide a semiconductor assembly of the above character in which particularly unique cross-overs are utilized.

Another object of the invention is to provide a semiconductor assembly of the above character in which a separate body or chip is utilized for the cross-overs.

Another object of the invention is to provide a semiconductor assembly of the above character in which yield is substantially increased.

Another object of the invention is to provide a semiconductor assembly which can be mass produced.

Additional features and objects of the invention will appear from the following description in which the preferred embodiments are set forth in detail in conjunction with the accompanying drawings.

Referring to the drawings.

In general, the semiconductor assembly consists of an insulating body which has passive elements formed thereon. A separate semiconductor body has separate junction devices formed thereon. Means is provided for interconnecting the junction devices and passive elements to provide integrated circuit. The means for interconnecting the junction devices and passive elements may include cross-over means to facilitate making connections between the junction devices and the passive elements.

Figure 1:
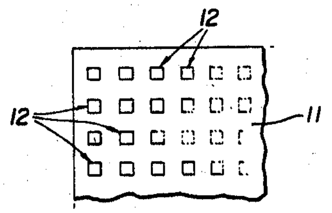
FIGURE 1 is an enlarged plan view of a slice or chip which has a plurality of arrays of resistive elements formed thereon.
Figure 3:
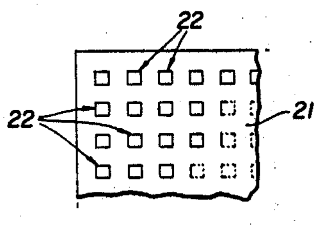
FIGURE 3 is an enlarged view of a semiconductor slice or chip with a plurality of arrays of junction devices together with capacitors formed thereon.
Figure 2:
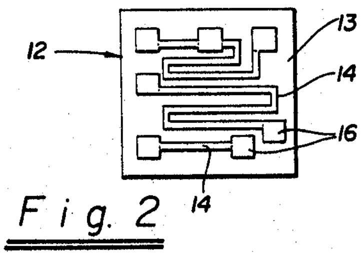
FIGURE 2 is a greatly enlarged view of a body with an array of resistive elements formed thereon and which has been cut from the chip or slice shown in FIGURE 1.

As shown in the drawings, the semiconductor assembly is constructed by first taking a slice or wafer 11 formed of suitable insulating material, such as glass or silicon, and forming on one planar surface thereof a very large number of passive devices as, for example, arrays 12 of thin film resistors. These thin film resistors can be formed in a manner well known to those skilled in the art. After they have been formed, the large wafer 11 is cut or diced into small bodies or chips 13, one of which is shown in FIGURE 2. Each body or chip contains the requisite number of thin film resistors 14 on one surface thereof for the integrated circuit to be formed in the semiconductor assembly and which are connected to connecting pads 16 also formed on the same planar surface of the body 13.

Figure 4:
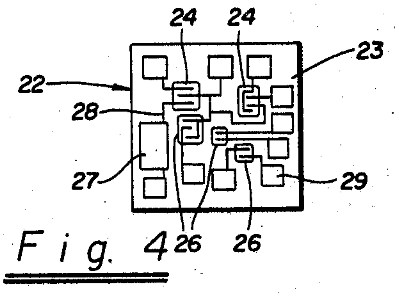
FIGURE 4 is a greatly enlarged view of a semiconductor and passive element body cut from the chip shown in FIGURE 3 and having an array of semiconductor junction devices and capacitors formed thereon.

A similar procedure is utilized for the junction devices and capacitors in which a large wafer 21 of a suitable semiconductor material, such as silicon, is utilized in which a plurality of arrays 22 are also formed upon one planar surface of the wafer 21 in a manner well known to those skilled in the art. After the arrays have been formed upon the wafer 21, the wafer 21 is cut into small bodies or chips 23 which contain the requisite number of junction devices and capacitors which form the array for use in the integrated circuit formed by the semiconductor assembly. Thus, as shown in FIGURE 4, such a semiconductor body can contain PN junction devices in the form of transistors 24 and in the form of diodes 26. The devices 24 and 26 can be isolated from each other in any suitable manner as by using diffused junction isolation or by using dielectric isolation techniques. The devices 24 and 26 each have at least one junction formed by at least two juxtaposed regions of opposite polarity extending to the planar surface. Thus, a diode is formed by one junction between P and N regions or N and P regions, and a transistor is formed by two junctions between P, N and P regions or N, P and N regions. Capacitors 27 are also provided on the chips 23 because the steps for their formation are very compatible with the steps for formation of the junction devices. The junction devices 24 and 26 and the capacitor 27 are connected by leads 28 formed on the same planar surface of the semiconductor body 23 to contact surfaces or pads 29 also formed on the same planar surface of the semiconductor body 23. The leads 28 engage the regions forming the devices 24 and 26.

Figures 5, 6:
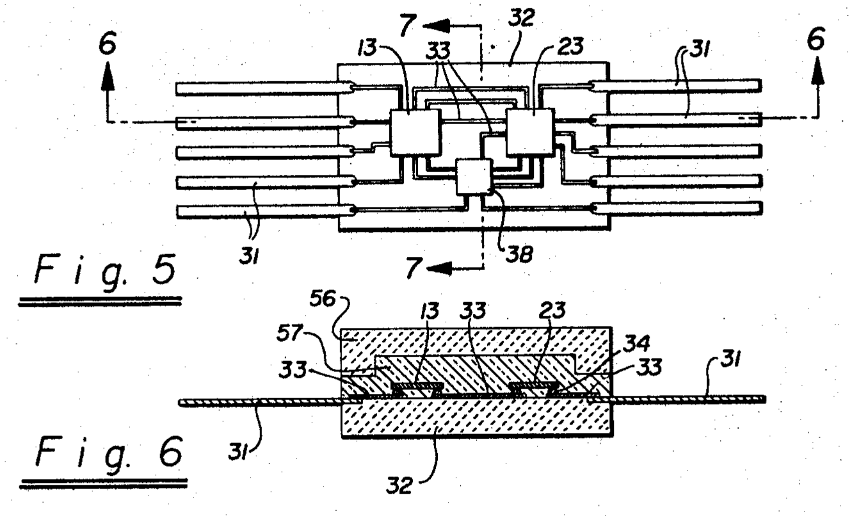
FIGURE 5 is a top plan view of a semiconductor assembly incorporating the present invention utilizing semiconductor bodies of the type shown in FIGURES 2 and 4 with a cross-over body.
FIGURE 6 is a cross-sectional view taken along the line 6—6 of FIGURE 5.

As shown in FIGURE 5, a plurality of leads 31 are formed in a body 32 of insulating material and form a package substrate. The leads 31 have their upper surfaces exposed in a plane flush with the top surface of the insulating body 32 as can be seen particularly in FIGURE 6. The leads 31 are disposed in predetermined arrays as shown in FIGURE 5.

Additional leads 33 are formed on the insulating body 32, as described in copending application Ser. No. 338,438, filed Jan. 17, 1964, by suitable techniques. For example, this can be accomplished by evaporating a conducting layer of a suitable material such as aluminum onto the insulating body 32 through a mask or by depositing the aluminum over the entire surface and then selectively removing the undesired portions by conventional etching techniques to provide the leads 33. The leads 33 are connected to the leads 31 and have their ends terminating in a predetermined pattern as determined by the pads 16 and 29 provided on the bodies 13 and 23 so that when the bodies 13 and 23 are inverted or turned upside down, the pads 16 and 29 will be in registration with the ends of the leads 33. Thereafter, suitable bonds are formed between the pads 16 and 29 and the ends of the leads 33 by suitable techniques such as ultrasonic bonding as described in copending application Ser. No. 201,056, filed June 8, 1962, now Patent No. 3,256,465, or by thermocompression bonding, to form a direct and intimate contact between the pads 16 and 29 and the ends of the leads 33. If it is desired to space the bodies 13 and 23 above the leads 33, the leads 33 can be provided with small raised portions or beads 34 formed of a suitable material such as aluminum and then pressure and heat utilized to form thermocompression bonds of a type well known to those skilled in the art whereby the pads 16 and 29 form an intimate contact with the raised portions 34 and in which the raised portions 34 form an intimate contact with the leads 33. Alternatively, if desired, the beads 34 can be deposited in the desired pattern upon the pads 16 and 19 instead of upon the leads 33 and then the thermocompression bonds can be formed in the same manner as hereinbefore described.

Thus, it can be seen that the leads 33 interconnect the semiconductor bodies 13 and 23 to provide a complete integrated circuit in which the portion of the integrated circuit requiring different processing techniques as, for example, thin film processing techniques, are provided on one of the bodies 13 and 23 and whereas the other elements of the integrated circuit as, for example, the junction devices 24 and 26 and passive elements such as the capacitors 27 requiring different processing techniques are provided on the other semiconductor body. The necessary external connections can be readily made to the integrated circuit through the leads 31 extending from the block 32.

Figure 7:
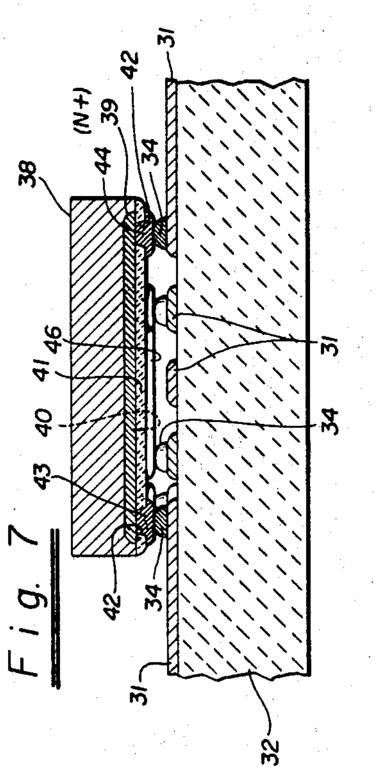
FIGURE 7 is a cross-sectional view taken along the line 7—7 of FIGURE 5.
Figure 8:
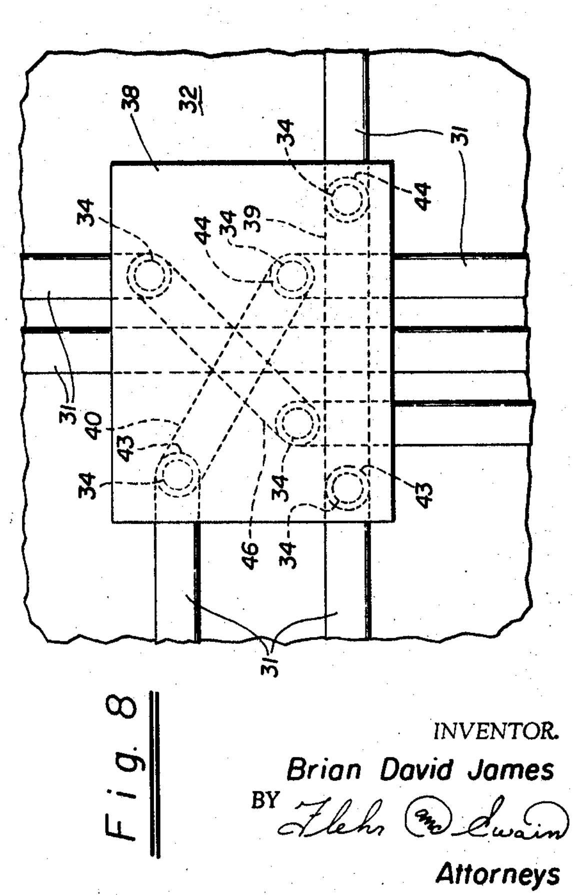
FIGURE 8 is an enlarged plan view of the cross-over shown in FIGURE 7.

In certain integrated circuitry, it may be necessary to provide cross-overs of the leads 33. As shown in FIGURES 5, 7 and 8, suitable means is provided for forming the necessary cross-overs. This means forming a cross-over includes a semiconductor body or chip 38. As shown in FIGURE 7, this body can consist of a P-type material in which highly doped regions 39 and 40 are formed. These highly doped regions can, for example, be N+ regions. It is, however, readily apparent that, if desired, the polarities of the material in the body 38 and regions 39 and 40 can be reversed so that the body is formed of N-type material and the highly doped regions 39 and 40 are of P-type material. An insulating layer 41 of a suitable material such as silicon dioxide is formed over the lower surface of the body 38 and over the region 39. Thereafter, openings 42 are formed in the layer of insulating material 41 which extend to the regions 39 and 40 by suitable means such as etching. A layer of conducting material is thereafter deposited upon the insulating layer 41 into the openings 42 by suitable means such as evaporation. The undesired portions of the metal layer are removed by suitable means such as etching to provide leads 43 and 44 which extend through the openings 42 and make contact with the N+ region 39. In addition, another lead 46 is formed from the layer which had been evaporated over the insulating layer 41. As can be seen from FIGURE 8, this lead 46 extends diagonally over the insulating block 38. Raised portions 34 of a suitable conducting material such as aluminum or gold are provided at the terminations of the leads 43, 44 and 46 or at the terminations of the leads 31. These raised areas serve to hold the cross-over chip away from the substrate and to make contact between the cross-over chip and the substrate leads. The substrate and the cross-over chip are bonded to each other by use of a suitable technique as hereinbefore described, such as ultrasonic or thermocompression bonding.

Thus, with the arrangement shown in FIGURES 7 and 8, it can be seen that a three-layer cross-over has been provided, that is, leads lie in three different planes. The first plane can be considered to be the leads 31 on the surface of the insulating block 32. The second layer can be considered to be the lead 46 which lies on the surface of the insulating layer 41 provided on the block or chip 38. The third layer can be considered to be the N+ regions 39 and 40 which form a connection between the leads 43 and 44 and are connected to the leads 31. Thus, it can be seen in FIGURE 7 that the three layers of leads actually lie in spaced parallel planes.

Although in the arrangement shown in FIGURES 7 and 8, only a single diffused cross-over in the form of the region 39 has been provided, it is readily apparent that, if desired, multiple diffused cross-overs can be provided in the semiconductor body 38 if they are desired and needed. For example, if necessary, as many as ten cross-overs in a single plane can be provided. It can be seen that the provision of the additional body or chip 38 makes it possible to provide cross-overs for the leads so that the leads do not touch each other or make contact with each other. To accomplish this, the leads are, in effect, raised off of the substrate or insulating block 32 in a certain area over the other leads and then come back down to the substrate on the other side of the leads.

Figures 9, 10:
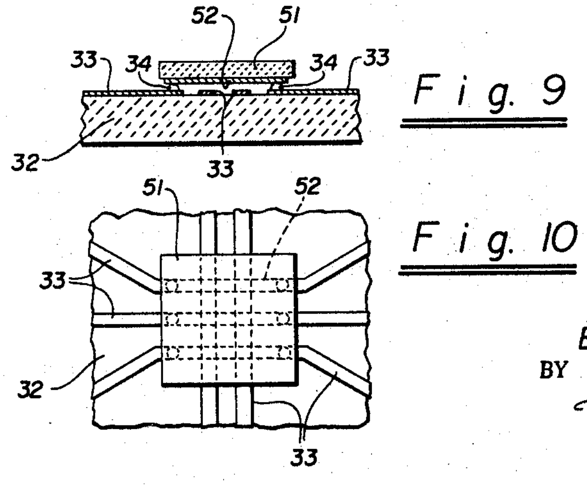
FIGURE 9 is a side elevational view of another cross-over arrangement.
FIGURE 10 is a plan view of the cross-over arrangement shown in FIGURE 9.

A simplified two-layer cross-over is shown in FIGURES 9 and 10 to be used in applications where it is only necessary to provide means for crossing one set of leads over another set or series of leads. When such is the case, a diffused cross-over is not required and a body 51 is provided which can be of any suitable insulating material as, for example, glass or ceramic. A plurality of cross-over leads 52 are evaporated onto the lower surface of the body 51 to provide a plurality of spaced parallel leads. These leads may be connected to the leads 33 via raised portions or beads 34 that are applied either to the leads 33 or to the cross-over leads 52. The cross-over leads 52 are then bonded to the substrate leads 33 by a suitable technique such as ultrasonic or thermocompression bonding. With such an arrangement, it can be seen that certain of the leads 33 can, therefore, extend over other of the leads 33 as shown particularly in FIGURES 9 and 10.

After the blocks 13, 23 and 38 have been bonded to the leads 33, the entire assembly can be encapsulated in the manner disclosed in my copending application Ser. No. 338,438, filed Jan. 17, 1964. As described therein, a cover 56 of suitable insulating material can be mounted over the top of the integrated circuitry and the space therebetween filled with a suitable glaze 57 so that the block 32 serves as the package substrate.

Figure 11:
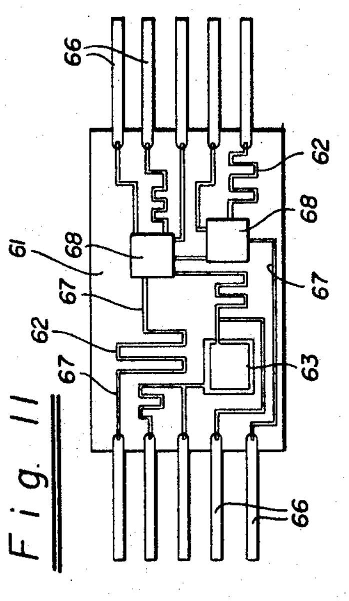
FIGURE 11 is a top plan view of another embodiment of my semiconductor assembly and shows an arrangement in which the thin film resistive and capacitive elements are deposited directly upon the package substrate and wherein the active semiconductor devices are bonded to the leads of the resistive and capacitive thin film elements carried by the substrate.

In FIGURE 11, there is shown another embodiment of my invention which includes an insulating body or package substrate 61 on which thin film resistors 62 are formed directly upon one planar surface of the package substrate 61. In addition, one or more thin film capacitors 63 are also formed directly upon the same planar surface of the package substrate 61 by conventional techniques. Leads 66 are mounted in the substrate and have exposed surfaces extending to the surface of the substrate and are connected to a plurality of leads 67 which are formed on the substrate 61 in a conventional manner in a predetermined arrangement. Semiconductor bodies 68 are provided which have the junction devices formed on one planar surface thereof in a manner hereinbefore described and which are provided with pads (not shown) formed on the same planar surface connected to the devices so that when the bodies 68 are turned upside down, bonds can be formed with the leads 67 by use of ultrasonics or by the use of thermocompression bonds as hereinbefore described.

Thus, it can be seen that with the arrangement shown in FIGURE 11, the thin film elements instead of being provided on a separate chip or block 13 as shown in FIGURE 5, are actually formed directly upon the substrate 61 and are directly connected to the leads 66 by the leads 67. With such an arrangement, it is only necessary to form the junction devices on separate blocks 68 as shown in FIGURE 11. Thus, it can be seen that this is a simplified arrangement which may be very suitable for integrated circuitry. Although cross-overs are not shown in the embodiment shown in FIGURE 11, it is readily apparent that, if desired, the cross-overs hereinbefore described can be utilized in the integrated circuitry shown in FIGURE 11 if such is required.

It is also readily apparent that the semiconductor assembly shown in FIGURE 11 can be encapsulated in the same manner as the embodiment shown in FIGURES 1–6 and as described in copending application Ser. No. 338,438, filed Jan. 17, 1964.

Figure 12:
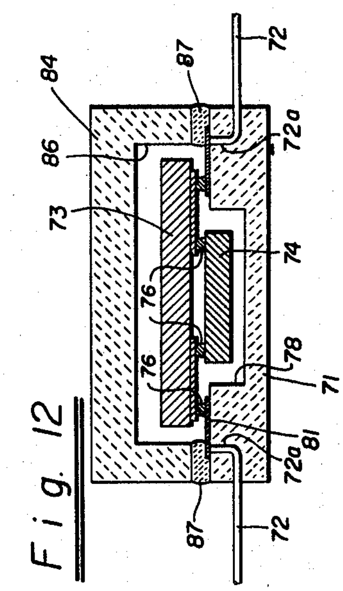
FIGURE 12 is still another embodiment of my semiconductor assembly in which two separate semiconductor bodies containing the resistive elements and the other containing the active devices are bonded together face to face and supported upon a separate package substrate.

Still another embodiment of my invention is shown in FIGURE 12 in which a body 71 of suitable insulating material is provided. Leads 72 are molded into the body and, as shown, are provided with portions 72*a* which extend up through the top surface of the body as shown in the drawing. In this semiconductor assembly shown in FIGURE 12, two separate bodies 73 and 74 have been provided. One of the bodies as, for example, body 73, can have the thin film elements deposited on one surface thereof in a manner hereinbefore described, whereas the other body, for example, body 74, may have the junction devices of the integrated circuitry formed on one surface thereof also in a manner hereinbefore described. Pads (not shown) are provided on both of the bodies in a predetermined arrangement and contact is made between the pads by placing the bodies face to face and in which one of the bodies is upside down as viewed in FIGURE 12. A bond is formed between the pads in a suitable manner as, for example, by ultrasonic bonding or by the use of thermocompression bonds using balls 76 of suitable material such as gold.

It will be noted from the arrangement shown in FIGURE 12, that one of the bodies is substantially larger than the other so that one of the bodies can be disposed in a recess 78 provided in the insulating block 71 and the other body 73 can overlie the upper surface of the insulating body 71. This makes it possible for the pads (not shown) provided on the body 73 to make contact with leads 81 formed on the upper surface of the insulating body 71 in a conventional manner to make contact with the leads. This contact can also be established by suitable means such as ultrasonic bonding or by the use of thermocompression bonding with the use of the gold balls 76.

The entire integrated circuit may then be hermetically sealed in a suitable manner by the use of a cover 84 formed of a suitable insulating material and which is provided with a recess 86 adapted to receive the body 73. The cover 84 is hermetically sealed to the insulating body 71 by suitable insulating material such as glaze 87.

The arrangement in FIGURE 12 is advantageous in that with the leads 72 extending into the insulating body 71 and having portions 72*a* thereof extending upwardly to the surface, it is easier to obtain a good hermetic seal between the cover 87 and the package substrate 71.

It is apparent from the foregoing that I have provided a new and improved semiconductor assembly which makes it possible to overcome the incompatibility of the processes for making thin films and the processes for making active devices in semiconductor bodies. In addition, it is possible to greatly increase the yield of the integrated circuits and to provide greater flexibility in the integrated circuits. The integrated circuits can be relatively complicated because cross-overs having a number of layers can be readily provided.

I claim:

1. In a multichip integrated circuit assembly, a rigid structure, at least a portion of the structure being formed of an insulating material, a plurality of thin film metallic connecitng elements disposed solely within the confines of the rigid structure, said connecting elements being electrically isolated from each other and having contact areas, a plurality of spaced leads mounted on said structure so that they are insulated from each other and are supported by the structure, means forming connections between said connecting elements and said leads so that said connecting elements are electrically connected to the leads and serve as extensions to the leads, a semiconductor body having junction circuit elements formed therein, said body also having conducting pads carried thereby connected to said junction circuit elements and lying in a common plane, an additional body formed of insulating material having exclusively passive circuit elements carried thereon, said additional body having conducting pads carried thereby and connected to said passive circuit elements, said rigid structure and said first named and additional bodies being positioned so that the contact areas of the connecting elements on the rigid structure and the pads on the first named and additional bodies are generally facing each other, and means forming electrical connections between said pads and said areas whereby said leads can be used to make contact with said junction circuit elements and said passive circuit elements to form a circuit.

2. An assembly as in claim 1 together with a cross-over body, at least one conducting strip carried by the cross-over body, said cross-over body and said rigid structure being positioned so that at least one of the strips carried by the cross-over body crosses over and is spaced from one of the connecting elements and portions of the strip are generally facing contact areas of two separate connecting elements and means forming electrical connections between said portions of said strip and said contact areas whereby said strip serves to electrically interconnect said two separate connecting elements.

3. An assembly as in claim 1 together with a cross-over body formed of a semiconductor material, a conductive region of semiconductor material formed adjacent a surface of the cross-over body and bounded by a junction formed in the cross-over body, a layer of insulating material formed on said cross-over body and overlying the conductive region of semiconductor material, two separate conductive strips extending through said insulating layer and making contact with said conductive region, said cross-over body being positioned so that said conductive region crosses over and is spaced from at least one of said connecting elements on said structure and so that said connecting strips generally face contact areas of two separate connecting elements on said structure and means forming electrical connections between said strips and said contact areas of said two separate connecting elements so that said conductive region and the conducting strips secured thereto form a part of the electrical circuit provided by said junction circuit elements and said passive circuit elements.

4. An assembly as in claim 3 together with an additional conducting strip carried by the cross-over body, said additional conducting strip being formed of a thin metallic film disposed on the insulating layer and being opposite at least a portion of the conductive region of the semiconductor material but being insulated therefrom by said layer of insulating material, said additional conducting strip being opposite from but spaced away from a connecting element carried by the rigid structure, portions of said additional conducting strip overlying two additional separate connecting elements on said structure, and means forming an electrical connection between said additional conducting strip and areas of said two additional connecting elements so that said additional conducting strip forms a part of the electrical circuit provided by said junction elements and said passive elements.

5. In a semiconductor assembly, a rigid structure, at least a portion of the rigid structure being formed of an insulating material, a plurality of thin film metallic connecting elements disposed solely within the confines of the structure and having contact areas, a cross-over body formed of a semiconductor material, a conductive region of the semiconductor material formed adjacent a surface of the cross-over body and bounded by a junction formed in the material, a layer of insulating material overlying the conductive region, contact elements carried by the cross-over body and extending through the insulating material and making contact with the conductive region, a conducting strip carried by the body, portions of which are adherent to said layer of insulating material and cross over the conductive region, said cross-over body being positioned so that said conductive region and said conducting strip are spaced from said connecting elements but cross over said connecting elements, and means forming electrical contact between said contact elements and contact areas of two separate connecting elements, and means forming electrical connections between portions of said conducting strip and contact areas of two additional separate connecting elements whereby said conductive region and said conductive strip serve to interconnect said separate connecting elements.

6. An assembly as in claim 5 together with a plurality of spaced conducting leads mounted on the structure so that they are insulated from each other and are supported by the structure.

7. In a semiconductor assembly, a semiconductor body having circuit elements carried thereby, said semiconductor body also having conducting pads carried thereby and connected to the circuit elements, said conducting pads lying in a common plane, a member formed of insulating material having a substantial planar surface, a plurality of spaced leads formed of a metallic material disposed on said surface, all portions of said leads on said member being secured to and being supported by the surface of the member, an insulating body having a recess therein and lead means carried by the insulating body, said member being positioned so that said leads on said member are facing said lead means and are in contact therewith, said semiconductor body being positioned in said recess out of contact with the insulating body and so that at least certain of said contact pads face said leads on said member and are bonded thereto whereby said leads on said member serve as the sole support for said semiconductor body.

8. An assembly as in claim 7 wherein said semiconductor body carries junction circuit elements and wherein said member has passive circuit elements carried thereby and connected to the leads carried by said member.

9. An assembly as in claim 7 together with means mounted upon the support structure for enclosing said insulating body and said semiconductor body to hermetically seal the same.

References Cited

UNITED STATES PATENTS

| | | | |
|---|---|---|---|
| 3,072,832 | 1/1963 | Kilby | 317—235 |
| 3,114,867 | 12/1963 | Szekely | 317—235 |
| 3,116,443 | 12/1963 | Forester et al. | 317—234 |
| 3,239,719 | 3/1966 | Shower | 317—101 |
| 3,256,465 | 6/1966 | Weissenstern et al. | 317—101 |
| 3,234,320 | 2/1966 | Chih Wong | 174—50.5 |
| 3,289,046 | 11/1966 | Carr | 317—101 |
| 3,292,240 | 12/1966 | McNutt et al. | 29—155.5 |
| 3,292,241 | 12/1966 | Carroll | 29—155.5 |

FOREIGN PATENTS

| | | |
|---|---|---|
| 988,075 | 4/1965 | Great Britain. |

JOHN W. HUCKERT, *Primary Examiner.*

R. F. SANDLER, *Assistant Examiner.*